(12) United States Patent
Wohlfahrt et al.

(10) Patent No.: US 7,003,432 B2
(45) Date of Patent: Feb. 21, 2006

(54) METHOD OF AND SYSTEM FOR ANALYZING CELLS OF A MEMORY DEVICE

(75) Inventors: Joerg Wohlfahrt, Taipei (TW); Thomas Hladschik, Leca da Palmeira (PT); Jens Holzhaeuser, Richmond, VA (US); Dieter Rathei, Graz (AT)

(73) Assignee: Infineon Technologies Richmond LP, Sandston, VA (US)

(*) Notice: Subject to any disclaimer, the term of this patent is extended or adjusted under 35 U.S.C. 154(b) by 84 days.

(21) Appl. No.: 10/749,460

(22) Filed: Dec. 30, 2003

(65) Prior Publication Data

US 2005/0149285 A1 Jul. 7, 2005

(51) Int. Cl.
*G01R 31/00* (2006.01)
*G06F 19/00* (2006.01)

(52) U.S. Cl. ............... 702/183; 702/118; 714/732
(58) Field of Classification Search ............ 702/118, 702/183, 184, 185; 714/715, 718, 721, 732, 714/735, 738; 438/10, 11, 12, 17; 365/189.9, 365/201
See application file for complete search history.

(56) References Cited

U.S. PATENT DOCUMENTS 5,901,105 A * 5/1999 Ong et al. ............. 365/230.06
6,330,697 B1 * 12/2001 Clinton et al. ............ 714/721
6,650,583 B1 * 11/2003 Haraguchi et al. .......... 365/201

* cited by examiner

*Primary Examiner*—Bryan Bui
(74) *Attorney, Agent, or Firm*—Brinks Hofer Gilson & Lione

(57) ABSTRACT

A method of analyzing cells of a memory device is disclosed. Generally, a plurality of fail signatures is generated, wherein each fail signature is associated with a type of failure. Voltages according to a plurality of test patterns are applied to nodes of a cell of the memory device. Fail data of the cell for the plurality of patterns is then analyzed, and a fail signature of the cell is determined. A type of failure of the cell based upon the plurality of fail signatures is then determined. A system for analyzing cells of a memory device is also disclosed. The system generally includes a plurality of probes applying different voltages to a cell of the memory device. A control circuit varies the voltages applied to the cell, and compares the failures of the cell as the test voltage applied to the cell is varied to an artificial bit map. Finally, an output device generates an output indicating a type of failure of the cell.

19 Claims, 5 Drawing Sheets

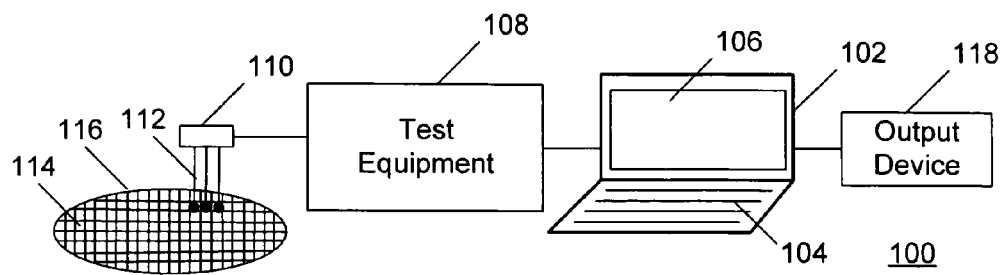
FIG. 1
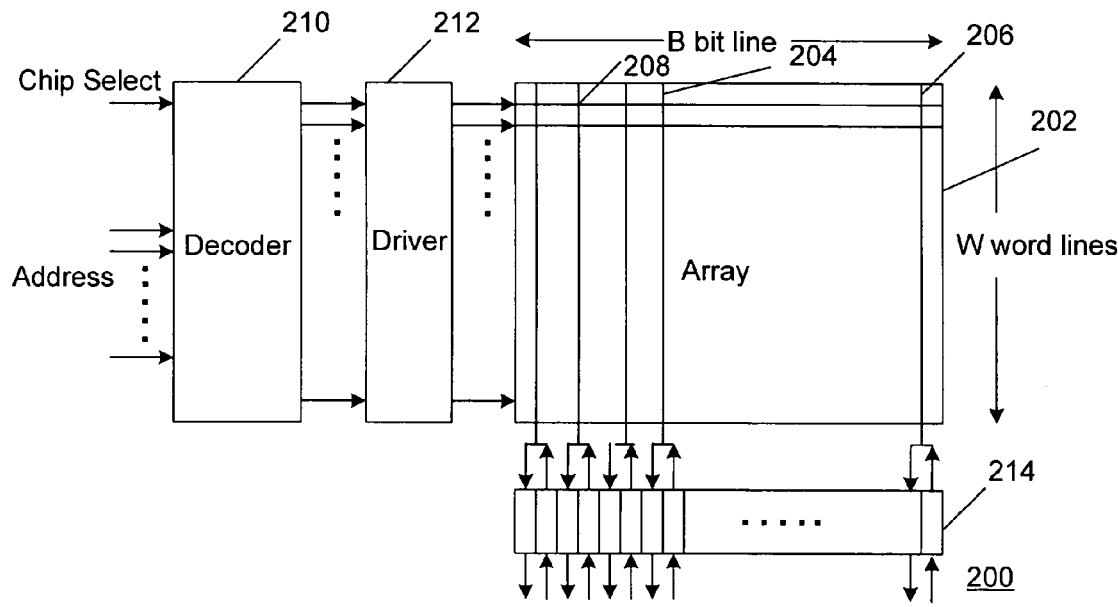
Data Out  FIG. 2
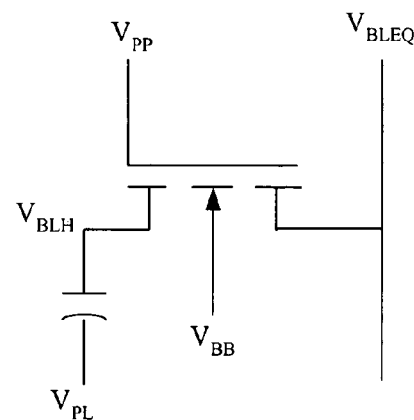
FIG. 3

| | | Test Conditions | | | | | | identified | | | | | |
|---|---|---|---|---|---|---|---|---|---|---|---|---|---|
| test | Testname | $t_{RET}$ [ms] | bumped? | PWELL $V_{BB}$ [V] | Plate $V_{PL}$ [V] | Bitline Equalize $V_{BLEQ}$ [V] | Bitline High $V_{BLH}$ [V] | BSJ/GIDL | BS Jctn. Lkg. | GIDL | Node Diel. | subVt | vert. FET |
| 99 | 3VFCN | <<tRET | no | Vbb | Vpl | Vbleq | Vblh | 0 | 0 | 0 | 0 | 0 | 0 |
| 200 | SIGA0 (nominal) | tRET | no | Vbb | Vpl | Vbleq | Vblh | 1 | 1 | 1 | 1 | 1 | 1 |
| 205 | SIGA1 | tRET | yes | Vbb-dVbb | Vpl | Vbleq | Vblh | 1 | 1 | 1 | 1 | 0 | 0 |
| 210 | SIGA2 | tRET | yes | Vbb+dVbb | Vpl+dVpl | Vbleq+dVbleq | Vblh | 1 | 1 | 1 | 1 | 0 | 1 |
| 215 | SIGA3 | tRET | yes | Vbb+dVbb | Vpl | Vbleq | Vblh | 0 | 0 | 1 | 1 | 1 | 1 |
| 220 | SIGA4 | tRET | no | Vbb | Vpl+dVpl | Vbleq | Vblh | 1 | 1 | 1 | 0 | 1 | 0 |
| 225 | SIGA5 | tRET | yes | Vbb-dVbb | Vpl-dVpl | Vbleq | Vblh | 0 | 1 | 0 | 1 | 1 | 0 |
| 230 | SIGA6 | tRET | no | Vbb | Vpl-dVpl | Vbleq | Vblh | X | X | X | X | X | X |
| 330 | SIGA7 (cum.) | n.a. | yes | n.a. | n.a. | n.a. | n.a. | X | X | X | X | X | X |

FIG. 8

| | | Test Conditions | | | | | | induced | | | | |
|---|---|---|---|---|---|---|---|---|---|---|---|---|
| test | Testname | $t_{RET}$ [ms] | bumped? | PWELL $V_{BB}$ [V] | Plate $V_{PL}$ [V] | Bitline Equalize $V_{BLEQ}$ [V] | Bitline High $V_{BLH}$ [V] | BS Jctn. Lkg. | GIDL | Node Diel. | subVt | vert. FET |
| 99 | 3VFCN | <<tRET | no | Vbb | Vpl | Vbleq | Vblh | 0 | 0 | 0 | 0 | 0 |
| 200 | SIGA0 (nominal) | tRET | no | Vbb | Vpl | Vbleq | Vblh | 0 | 0 | 0 | 0 | 0 |
| 205 | SIGA1 | tRET | yes | Vbb-dVbb | Vpl | Vbleq | Vblh | 1 | 0 | 0 | 0 | 0 |
| 210 | SIGA2 | tRET | yes | Vbb+dVbb | Vpl+dVpl | Vbleq+dVbleq | Vblh | 0 | 1 | 0 | 0 | 0 |
| 215 | SIGA3 | tRET | yes | Vbb+dVbb | Vpl | Vbleq | Vblh | 0 | 0 | 0 | 1 | 1 |
| 220 | SIGA4 | tRET | no | Vbb | Vpl+dVpl | Vbleq | Vblh | 0 | 0 | 0 | 0 | 0 |
| 225 | SIGA5 | tRET | yes | Vbb-dVbb | Vpl-dVpl | Vbleq | Vblh | 0 | 0 | 0 | 0 | 0 |
| 230 | SIGA6 | tRET | no | Vbb | Vpl-dVpl | Vbleq | Vblh | 0 | 0 | 1 | 0 | 1 |
| 330 | SIGA7 (cum.) | n.a. | yes | n.a. | n.a. | n.a. | n.a. | 1 | 1 | 1 | 1 | 1 |

FIG. 9

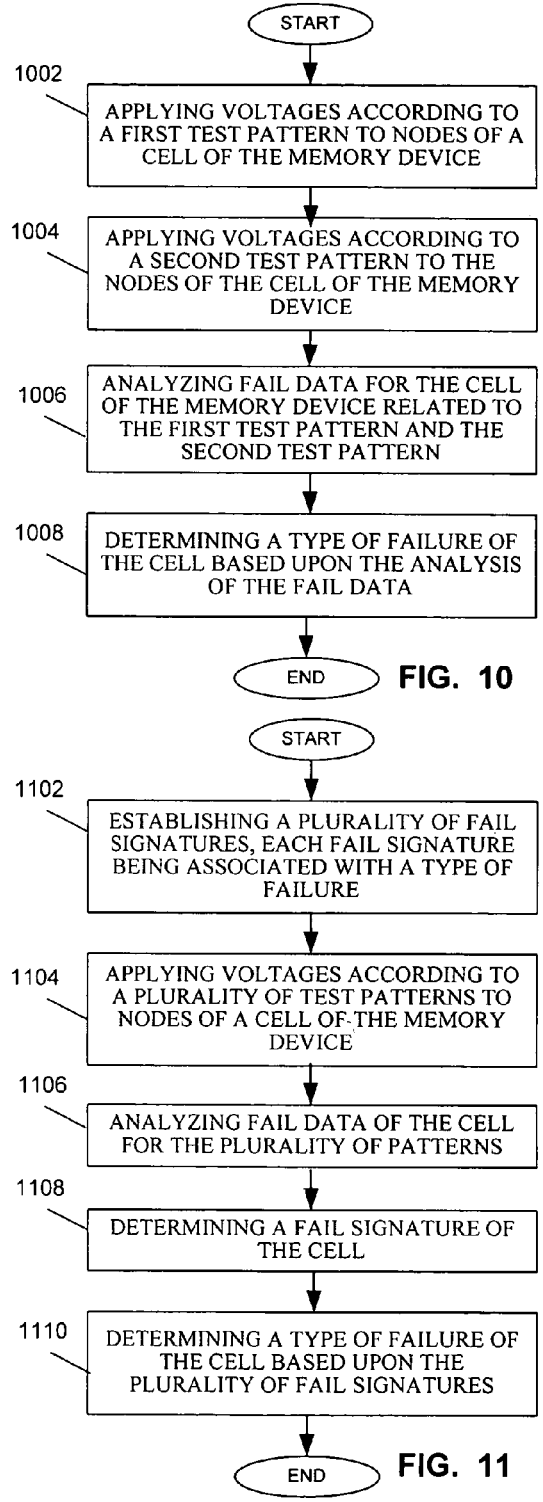
FIG. 10
FIG. 11
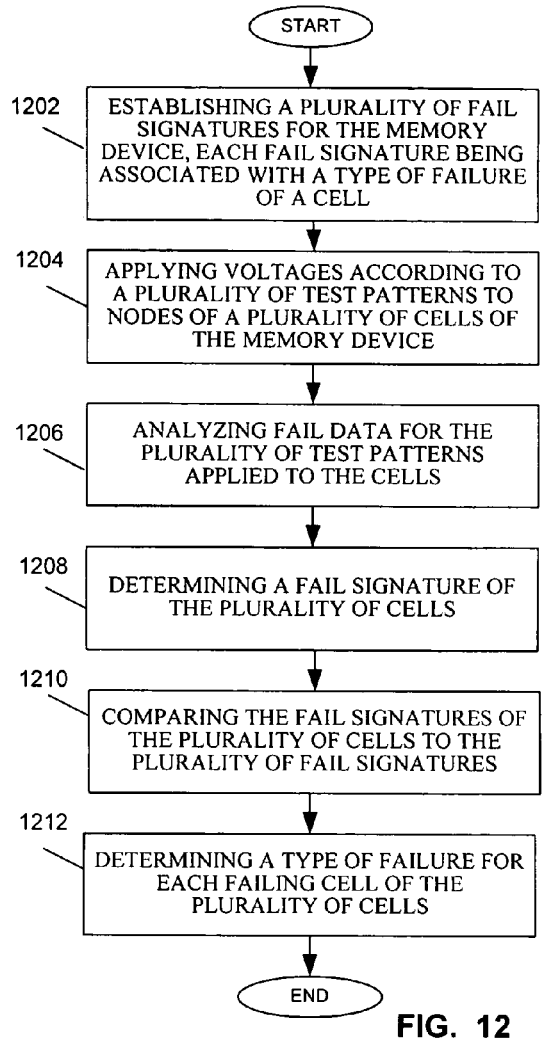
FIG. 12

US 7,003,432 B2

METHOD OF AND SYSTEM FOR ANALYZING CELLS OF A MEMORY DEVICE

FIELD OF THE INVENTION

The present invention relates generally to memory devices, and in particular, to a method of and system for analyzing cells of a memory device.

BACKGROUND OF THE INVENTION

In a memory device, such as a dynamic random access memory (DRAM), information is stored in capacitors accessed via a transistor (i.e. transfer gate). The two different states this capacitor (i.e. charged or discharged) can be set to corresponding to the two different pieces of information needed in digital algebra, "true" and "false". A variety of leakage currents may lead to a loss of information by discharging this capacitor without access being controlled. In order to take the proper corrective steps to improve the manufacturing process of the device, it may be beneficial to identify the primary causes of the leakage. It may be beneficial to distinguish between leakage related to failing cells (i.e. "soft fails") from other failing cells (i.e. "hard fails") in order to determine the appropriate corrective actions.

A standard DRAM design uses a wordline (WL)/bitline (BL) architecture, where a DRAM storage cell is addressed by a specific WL and a BL address. Process faults lead to failures in wordlines and/or bitlines, causing complete and/or partial WL and/or BL fails and/or other fail patterns like single cells, paired cells, etc. Fails in a very early state of WL/BL address decoding hierarchy of course lead to multiple WL or BL failures or even to failures of large memory cell blocks. Due to redundancy limitations, block fails may not be repairable, although sparse fails (WL, BL and single cell fails) can be repaired if not too densely packed.

Because of the reverse biased junction between a capacitor and p-well of the transfer device, a reverse current or junction leakage will decrease the amount of charge stored in the capacitor over time. In order to get correct results of a READ operation, the information stored in the capacitor cell has to be refreshed periodically. Leakage current and refresh intervals are synchronized so that the information stored will not dissipate, unless additional leakage will disturb this synchronization leading to soft fails. Typically, partial WL or BL fails turn into full WL or BL fails over time. In addition to the filled up WL and BL fails, some weak single cells (SC) and paired cells (PC) will start to fail with a longer time between the refresh cycles.

Because partial WL fails need to be repaired with a redundant WL element, the repair of the entire WL comes at no additional costs of redundant cells. However, unlike those fails of a partial WL or BL or a full WL or BL, single cell or paired cell fails are randomly distributed across the memory cell array and require one redundancy array (RA) element for each fail. Such single cell or paired cell fails can make it difficult to repair a cell, and therefore such information can be critical in determining whether a cell can be repaired.

Accordingly, there is a need for an improved system and method of analyzing cells of a memory device.

SUMMARY OF THE INVENTION

A method of analyzing cells of a memory device is disclosed. The method allows a non destructive, automized analysis of the prevailing leakage mechanisms in memory cells such, as DRAMs. Hence, main data retention yield detractors can be identified and corrective process actions can be taken. Since the method is used at wafer level and is non destructive, components can be built and their behaviour in burn-in, early life tests etc. can be observed.

The method generally comprises steps of establishing a plurality of fail signatures, wherein each fail signature is associated with a type of failure. Voltages according to a plurality of test patterns are applied to nodes of a cell of the memory device. Fail data of the cell for the plurality of patterns is then analyzed, and a fail signature of the cell is determined. A type of failure of the cell is then determined based upon the plurality of fail signatures.

A system for analyzing cells of a memory device is also disclosed. The system preferably comprises a plurality of probes applying test voltages to a cell of the memory device. A control circuit varies the voltages applied to the cell, and analyzes the failures of the cell as the voltages applied to the cell are varied. Finally, an output device generates an output indicating a type of failure of the cell.

BRIEF DESCRIPTION OF THE DRAWINGS

FIG. 1 is a block diagram of a system for analyzing cells of a memory device according to the present invention;

FIG. 2 is a block diagram of a dynamic random access memory according to the present invention;

FIG. 3 is a circuit diagram of a cell of the dynamic random access memory of FIG. 2;

FIG. 8 is a signature table showing signatures for cells of a particular device during nominal test conditions according to the present invention;

FIG. 9 is a signature table showing induced leakage signatures for cells of a particular device according to the present invention;

FIG. 10 is a flow chart showing a method of analyzing cells of a memory device according to the present invention;

FIG. 11 is a flow chart showing a method of analyzing cells of a memory device according to an alternate embodiment of the present invention; and FIG. 12 is a flow chart showing a method of analyzing cells of a memory device according to a further embodiment of the present invention.

DETAILED DESCRIPTION OF THE DRAWINGS

Figure 4:
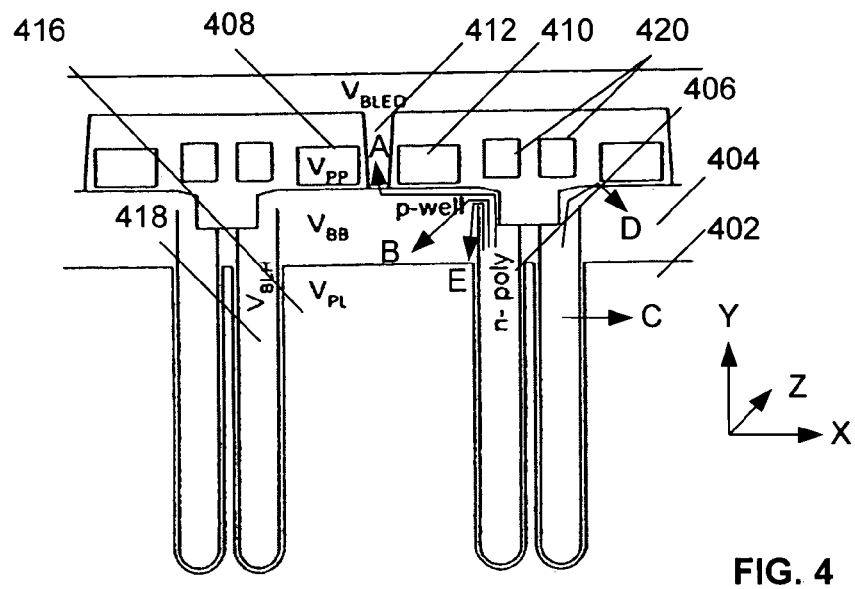
FIG. 4 is a cross section of a portion of a cell of the dynamic random access memory of FIG. 2.

Turning first to FIG. 1, a block diagram of a system for analyzing cells of a memory device according to the present invention is shown. In particular, a system 100 comprises a computer 102 having a user interface 104 and a display 106, which is coupled to test equipment 108. The test equipment 108 preferably comprises probes 112 which are adapted to provide voltages to nodes of a chip 114 of a wafer 116. The computer 102 is preferably coupled to an output device 118. The output device 118 could be, for example, a printer, a storage device, or some other means for receiving data recorded by the computer 102. The computer 102 could be any device having a control circuit, such as microprocessor or an application specific integrated circuit (ASIC) for enabling the processing of data and the generation of an output, as will be described in more detail reference to the remaining figures. Similarly, test equipment 108 including test fixture 110 could be any type of conventional test equipment for applying voltages to nodes of the integrated circuit. Although an example of a system for analyzing cells of a memory device is shown in FIG. 1, other systems well known in the art could be used to implement the present invention.

Turning now to FIG. 2, a block diagram of a dynamic random access memory according to the present invention is shown. In particular, a DRAM 200 comprises an array 202 of cells having a plurality of the bit lines 204 and a plurality of word lines 206. A cell 208, which is formed at the intersection of a word line and a bit line as is well known in the art, is shown in more detail in reference to FIGS. 3 and 4. A decoder 210 is coupled to receive a chip select signal and an address, and generates an output to a driver 212. The driver 212 addresses a cell of the chip to read or write data to the DRAM by way of a sense amplifier 214. The method of the present invention enables detecting cells of the DRAM which are failing or leaking, and determine a type of failure for a given cell.

Turning now to FIGS. 3 and 4, a circuit diagram and a cross sectional view of a cell of the dynamic random access memory of FIG. 2 are shown in FIGS. 3 and 4, respectively. The standard single device cell of the DRAM consists of a single capacitor located across source and drain of a negatively biased transistor. The schematic of DRAM trench cell with transfer gate preferably has the following default voltages:

| | | |
|---|---|---|
| $V_{BB}$ | −V1 | back bias |
| $V_{PP}$ | +3.5 * V1 | wordline boost voltage |
| $V_{BLEQ}$ | +V1 | bitline equalize voltage |
| $V_{BLH}$ | +2 * V1 | bitline high voltage |
| $V_{PL}$ | +V1 | plate voltage |

The applied voltages can be externally forced to different values via bond pads. These bond pads are generally available only during wafer test, and therefore they will not be connected to pins of the lead frame. In order to determine which leakage was responsible for a single cell (SC) or a paired cell/ (PC) to fail at data retention (i.e. a certain refresh interval), the internal voltage of the chip can be varied in a way that this leakage will be reduced and the failing cell will pass. However, this variation suppressing one leakage mechanism can induce other leakage currents making the cell fail again. Based upon an understanding of the cells of the chip and through experimentation, failure signatures for a cell of a given device can be developed. As will be described in more detail in reference to remaining figures, a series of voltage patterns are applied and the failure pattern for a cell is analyzed to determine the type of failure.

Turning now to FIG. 4, a cross section of a portion of a cell of the dynamic random access memory of FIG. 2, and identifying various nodes of the schematic diagram of FIG. 3, is shown. In particular, a substrate 402 has a p-well 404 and a plurality of n-poly trenches 406. A word line 408 (comprising the $V_{PP}$ node) and a word line 410 (both of which extend in the z-direction) are formed over the p-well, while a bit line 412 extends over the word lines including word line 410 and additional word lines 420. A $V_{PL}$ node 416 and a $V_{BLH}$ node 418 are also shown. As is well known in the art, there are five main contributors to the total leakage of the cell leading to single cell and paired cell retention fails, as indicated by the arrows A through E. In particular, arrow A represents sub $V_t$ leakage. Arrow B represents Buried Strap (BS) junction leakage. Arrow C represents node dielectric leakage. Arrow D represents gate-induced drain leakage (GIDL) leakage. Finally, arrow E represents vertical field effect transistor (FET) leakage. (labels 412 and 420 are never mentioned)

When identifying which leakage mechanism is dominant in affecting data retention, determining fail counts is not an effective method. For example, a relatively small number of randomly distributed single cell fails make a chip not repairable, while 2046 fails of a partially failing WL where the WL has a length of 2048, for example, or even a fully failing WL do not affect reparability of the cell. That is, a redundant word line can be used to replace the failing word line. The method of the present invention distinguishes dangerous SC/PC fails from WL/BL oriented retention fails by making a Bit Fail Map (BFM) related to a data retention test, extracting addresses of WL/BL failures, and counting only those failures that do not have more than one address in one direction in common with a single cell, and counting those with exactly 2 addresses in common with a distance of less than 3 addresses as paired cells.

Figure 5:
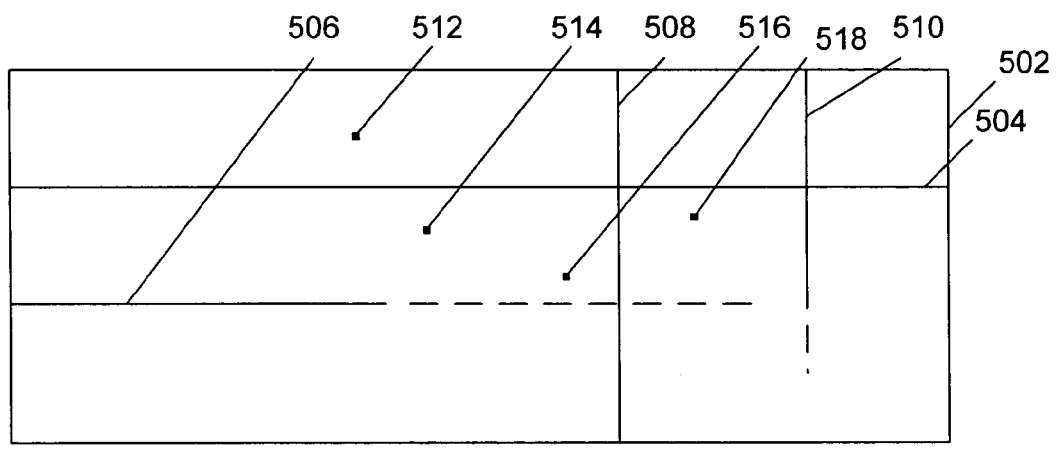
FIG. 5 is a bit fail map of a memory device generated according to a first step of the present invention.

As shown in FIG. 5, a bit fail map of a memory chip, for example a bit fail map of one 1M segment of a 64 Mb device 502, generated according to a first step of the present invention is shown. As can be seen in the bit fail map of FIG. 5, the following failed lines or cells exist before removing WL/BL failures:

horizontal: 1 full WL fail 504, 1 partial WL fail 506 extending to a full WL at data detention vertical: 1 full BL fail 508, 1 partial BL fail 510 extended to a full BL at data retention random: 2 SC (hard), 4 SC (soft) 512–518.

Figure 6:
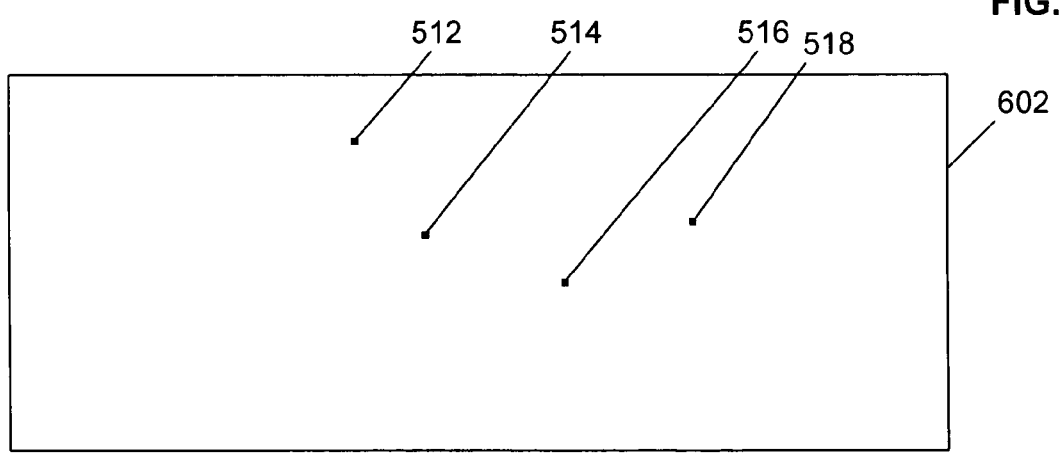
FIG. 6 is a bit fail map of a memory device generated according to a second step of the present invention.

As shown in FIG. 6, bit map of a memory chip generated according to a second step of the present invention (i.e, after removing WL/BL failures) is shown. In particular, the method of the present invention distinguishes dangerous SC/PC fails from WL/BL oriented retention fails by creating an artificial Bit Fail Map (BFM) after data retention test from the stored BFMs, extracting addresses of failures, and counting only those that do not have more than one address in one direction in common as SC and those with exactly 2 addresses in common with a distance of less than 3 addresses as paired cells. A spatial distribution comprising an artificial SC/PC map is created as shown in FIG. 6.

Figure 7:
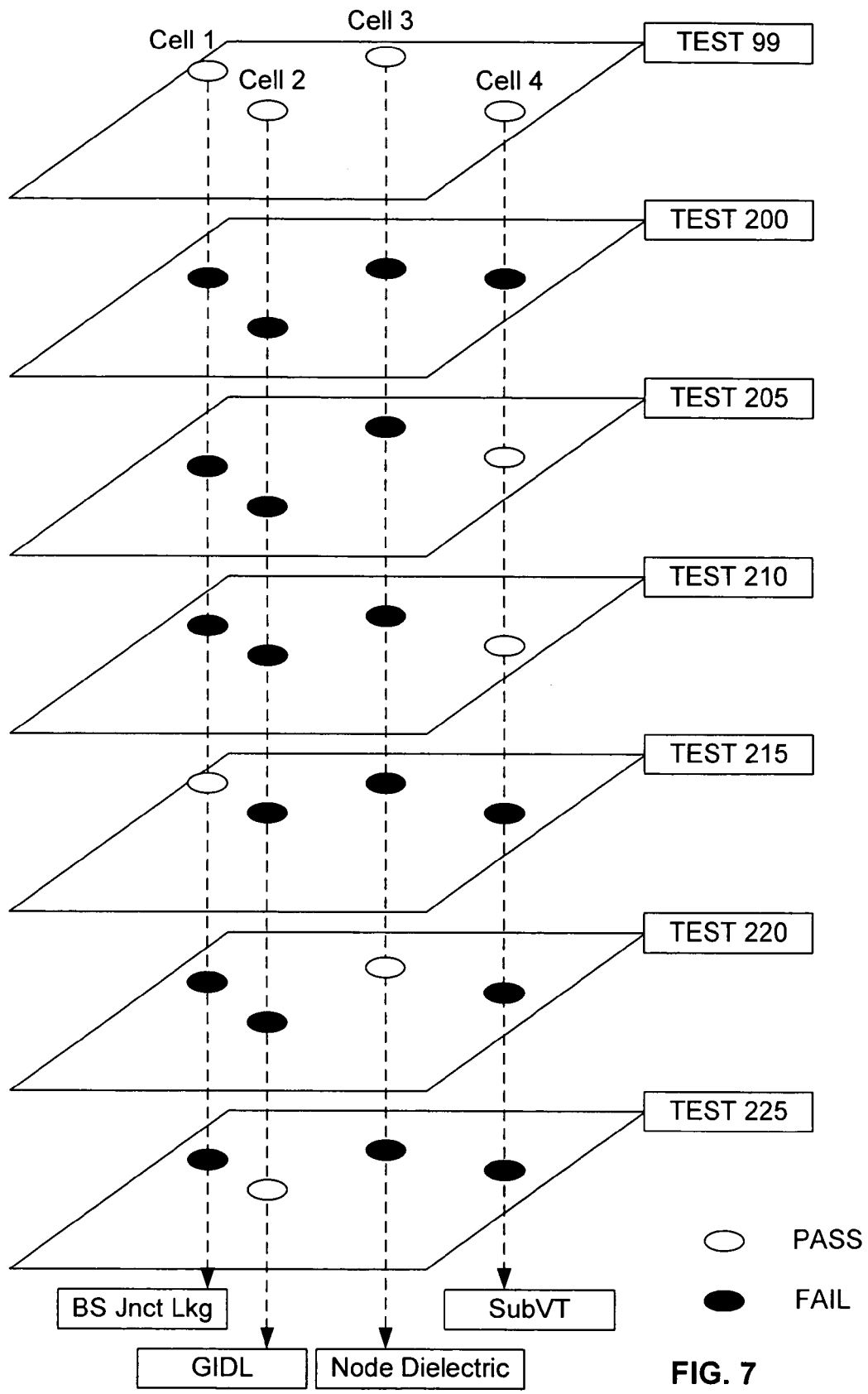
FIG. 7 is an overlay of bit maps according to the present invention.

Turning now to FIG. 7, an overlay of bit maps according to the present invention is shown. A combination of several measurements, each performed at different, selectively chosen voltage conditions is needed to distinguish different leakage mechanisms. For each test a bit fail map is stored. At the end of the test sequence, the cumulative failures of all tests are stored as well in a separate bit map. The combination of tests passed and failed is the fail signature of a cell. That is, for each cell (designated cell1–cell4), a signature associated with the cell based upon the pass or fail of the cell for a particular test.

For identifying retention SC/PC fails failing under nominal conditions, one measurement has to be taken under nominal conditions. The artificial SC/PC map (SC map) is created from the cumulative map. The SC map is overlaid with the test maps to identify the root cause for the fails. If the pass/fail signature of the test maps then corresponds to the one particular leakage mechanism, the mechanism is identified. Simple statistics of the different signatures (e.g. counts, chip median/means, wafer median/means, etc) distinguish major and minor effects. The same simple statistics of the induced SC/PC failures lead to a statement about the leakage sensitivity of a product.

Turning now to FIG. 8, a signature table shows signatures for cells of a particular device during nominal operation according to the present invention is shown. The table is developed based upon analysis of a particular chip by individuals having knowledge of the performance of the chip and through testing. The exemplary data shown in FIG. 8 represents signatures of cell failures of a particular DRAM. However, it should be noted that those signatures are given by way of example, and could be different test conditions or different products. For example, the signature table of FIG. 9 shows induced leakage signatures for cells of a particular device. These leakages are caused by the application of the various patterns of test voltages, but do not indicate a fail cell under nominal conditions.

Turning now to FIG. 10, a flow chart shows a method of analyzing cells of a memory device according to the present invention. In particular, voltages according to a first test pattern are applied to nodes of a cell of the memory device at a step 1002. Voltages are then applied according to a second test pattern to the nodes of the cell of the memory device at a step 1004. Fail data for the cell of the memory device related to the first test pattern and the second test pattern is then analyzed at a step 1006. A type of failure of the cell based upon the analysis of the fail data is then determined at a step 1008.

Turning now to FIG. 11, a flow chart shows a method of analyzing cells of a memory device according to an alternate embodiment of the present invention. In particular, a plurality of fail signatures is established at a step 1102. Each fail signature is associated with a type of failure. Voltages according to a plurality of test patterns are then applied to nodes of a cell of the memory device at a step 1104. Fail data of the cell for the plurality of patterns is then analyzed at a step 1106. A fail signature of the cell is then determined at step 1108, and a type of failure of the cell based upon the plurality of fail signatures is determined at a step of 1110.

Turning now to FIG. 12, a flow chart shows a method of analyzing cells of a memory device according to a further embodiment of the present invention. In particular, a plurality of fail signatures for the memory device is established at a step 1202. Each fail signature is associated with a type of failure of a cell. Voltages are applied according to a plurality of test patterns to nodes of a plurality of cells of the memory device at a step 1204. Fail data for the plurality of test patterns applied to the cells at a step 1206. A fail signature of the plurality of cells is determined at a step 1208. The fail signatures of the plurality of cells are compared to the plurality of fail signatures at a step 1210, and a type of failure for each failing cell of the plurality of cells is determined at a step 1212.

It can therefore be appreciated that the new and novel system and method of analyzing cells of a memory device has been described. The method can be applied to all trench technologies, using the same cell and transistor technology as ES3, SS3, 256M-S17, etc., independent from structural size or chip architecture. It will be appreciated by those skilled in the art that, particular the teaching herein, numerous alternatives and equivalents will be seen to exist which incorporate the disclosed invention. As a result, the invention is not to be limited by the foregoing embodiments, but only by the following claims.

The invention claimed is:

1. A method of analyzing cells of a memory device, said method comprising the steps of:
    applying voltages according to a first test pattern to nodes of a cell of said memory device;
    applying voltages according to a second test pattern to said nodes of said cell of said memory device;
    analyzing fail data for said cell of said memory device related to said first test pattern and said second test pattern;
    determining a fail signature for said cell; and
    determining a type of failure of said cell based upon the analysis of said fail data.

2. The method of claim 1 wherein said steps of applying voltages comprises steps of applying voltages to a node of a cell of a dynamic random access memory.

3. The method of claim 1 further comprising a step of establishing a plurality of fail signatures, each fail signature being associated with a type of failure.

4. The method of claim 3 wherein said step of determining a type of failure comprises a step of comparing a fail signature of a cell to said plurality of fail signatures.

5. A method of analyzing cells of a memory device, said method comprising the steps of:
    establishing a plurality of fail signatures, each fail signature being associated with a type of failure;
    applying voltages according to a plurality of test patterns to nodes of a cell of said memory device; analyzing fail data of said cell for said plurality of patterns;
    determining a fail signature of said cell; and
    determining a type of failure of said cell based upon said plurality of fail signatures.

6. The method of claim 5 wherein said step of establishing a plurality of fail signatures comprises a step of establishing fail signatures for nominal operation.

7. The method of claim 6 wherein said step of establishing a plurality of fail signatures for nominal operation comprises establishing fail signatures associated with complete failure of cells during nominal operation.

8. The method of claim 5 wherein said step of establishing a plurality of fail signatures comprises a step of establishing induced fail signatures.

9. The method of claim 8 wherein said step of establishing induced fail signatures comprises a step of establishing fail signatures indicating a leakage condition.

10. A method of analyzing cells of a memory device, said method comprising the steps of:
    establishing a plurality of fail signatures for said memory device, each fail signature being associated with a type of failure of a cell;
    applying voltages according to a plurality of test patterns to nodes of a plurality of cells of said memory device;
    analyzing fail data for said plurality of test patterns applied to said cells; determining a fail signature of said plurality of cells;
    comparing said fail signatures of said plurality of cells to said plurality of fail signatures; and
    determining a type of failure for each failing cell of said plurality of cells.

11. The method of claim 10 wherein said step of establishing a plurality of fail signatures comprises a step of establishing fail signatures indicating failures during nominal operation.

12. The method of claim 10 wherein said step of establishing a plurality of fail signatures comprises a step of establishing fail signatures indicating leakage conditions.

13. The method of claim 10 further comprising a step of generating a first bit map having both hard fails and soft fails.

14. The method of claim 13 further comprising a step of generating a second bit map based upon said first bit map, said second bit map eliminating hard fails.

15. A system for analyzing cells of a memory device, said system comprising:

a plurality of probes applying different test voltages to a cell of said memory device;

a control circuit varying the voltages applied to said cell, said control circuit comparing the failures of said cell as the test voltages applied to said cell are varied to an artificial bit fail map; and an output device generating an output indicating a type of failure of said cell.

16. The system of claim 15 wherein said control circuit varies the voltage applied to said cell according to a plurality of test patterns.

17. The system of claim 15 wherein said plurality of probes apply test voltages to a plurality of cells.

18. The system of claim 15 wherein said output device comprises a printer.

19. The system of claim 15 wherein said output device comprises a display.

* * * * *